United States Patent
Ashidate et al.

(10) Patent No.: US 12,400,981 B2
(45) Date of Patent: *Aug. 26, 2025

(54) METHOD FOR MANUFACTURING SEMICONDUCTOR DEVICE

(71) Applicant: Kioxia Corporation, Tokyo (JP)

(72) Inventors: Hiroaki Ashidate, Mie Mie (JP); Tomoyuki Takeishi, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 102 days.

This patent is subject to a terminal disclaimer.

(21) Appl. No.: 18/176,189

(22) Filed: Feb. 28, 2023

(65) Prior Publication Data

US 2023/0411322 A1 Dec. 21, 2023

(30) Foreign Application Priority Data

Jun. 20, 2022 (JP) .................................. 2022-098828

(51) Int. Cl.
  *H01L 23/00* (2006.01)
  *H01L 21/02* (2006.01)
  (Continued)

(52) U.S. Cl.
  CPC ........ *H01L 24/06* (2013.01); *H01L 21/02123* (2013.01); *H01L 21/02521* (2013.01);
  (Continued)

(58) Field of Classification Search
  CPC ............... H01L 24/06; H01L 21/02123; H01L 21/02521; H01L 21/302; H01L 21/603;
  (Continued)

(56) References Cited

U.S. PATENT DOCUMENTS

| 7,723,209 B2 | 5/2010 | Maruyama et al. |
| 9,870,922 B2 | 1/2018 | Suga et al. |

(Continued)

FOREIGN PATENT DOCUMENTS

| CN | 102106006 A | * | 6/2011 | ......... H01L 21/6835 |
| EP | 2270865 A2 | * | 1/2011 | ........... B06B 1/0622 |

(Continued)

*Primary Examiner* — Mohammed Shamsuzzaman
(74) *Attorney, Agent, or Firm* — Foley & Lardner LLP

(57) ABSTRACT

A method for manufacturing a semiconductor device, a first structure is formed on a first substrate. A first bonded body is formed by bonding a supporting substrate lower in rigidity than the first substrate to a first principal surface, on which the first structure is formed, of the first substrate. The first substrate is removed from the first bonded body. A second structure is formed on a second substrate. A third structure is formed on a third substrate. A second bonded body is formed by bonding a second principal surface, on which the second structure is formed, of the second substrate to a third principal surface, on which the third structure is formed, of the third substrate. The second substrate is removed from the second bonded body. A third bonded body is formed by bonding a fourth principal surface, which is exposed after the first substrate is removed, of the first bonded body to a fifth principal surface, which is exposed after the second substrate is removed, of the second bonded body. The supporting substrate is removed from the third bonded body.

14 Claims, 12 Drawing Sheets

(51) Int. Cl.
*H01L 21/302* (2006.01)
*H01L 21/603* (2006.01)
*H01L 21/768* (2006.01)
*H10D 48/32* (2025.01)

(52) U.S. Cl.
CPC .......... *H01L 21/302* (2013.01); *H01L 21/603* (2021.08); *H01L 21/76865* (2013.01); *H10D 48/366* (2025.01)

(58) Field of Classification Search
CPC . H01L 21/76865; H01L 29/685; H01L 24/80; H01L 2224/80006; H01L 2224/80121; H01L 2224/80357; H01L 2224/80895; H01L 21/7806; H01L 24/11; H01L 24/81; H01L 25/18; H01L 2224/81005; H10B 80/00; H10B 43/10; H10B 43/27; H10B 43/50
See application file for complete search history.

(56) References Cited

U.S. PATENT DOCUMENTS

| | | | |
|---|---|---|---|
| 10,074,667 B1 * | 9/2018 | Higashi | H10B 41/23 |
| 10,211,166 B2 * | 2/2019 | Matsuo | H01L 25/50 |
| 2004/0163478 A1 * | 8/2004 | Xu | H10N 30/074 257/E27.006 |
| 2009/0110017 A1 | 4/2009 | Aihara | |
| 2018/0261575 A1 | 9/2018 | Tagami et al. | |
| 2018/0261623 A1 * | 9/2018 | Higashi | H10B 43/50 |
| 2018/0277515 A1 | 9/2018 | Homma et al. | |
| 2019/0318957 A1 * | 10/2019 | Godet | H01L 21/311 |
| 2020/0091088 A1 | 3/2020 | Wakatsuki et al. | |
| 2020/0286913 A1 | 9/2020 | Noguchi | |
| 2020/0294963 A1 * | 9/2020 | Soda | H01L 21/568 |
| 2021/0074672 A1 * | 3/2021 | Matsuo | H01L 21/6835 |
| 2023/0411344 A1 * | 12/2023 | Ashidate | H01L 24/98 |

FOREIGN PATENT DOCUMENTS

| | | | | | |
|---|---|---|---|---|---|
| JP | 2005183374 A | * | 7/2005 | | G02F 1/1333 |
| JP | 2007088491 A | * | 4/2007 | | G01R 31/31723 |
| JP | 2009294602 A | * | 12/2009 | | H01L 24/82 |
| JP | 5334411 B2 | * | 11/2013 | | H01L 21/6835 |
| JP | 2014-044981 | | 3/2014 | | |
| JP | 5857094 B2 | | 2/2016 | | |
| JP | 2018-148071 A | | 9/2018 | | |
| JP | 2018-152419 A | | 9/2018 | | |
| JP | 6395333 B2 | | 9/2018 | | |
| JP | 2018-160522 A | | 10/2018 | | |
| JP | 2018-163970 A | | 10/2018 | | |
| JP | 2020-047706 A | | 3/2020 | | |
| JP | 2020-145279 A | | 9/2020 | | |
| TW | 201432958 A | * | 8/2014 | | H01L 24/82 |
| TW | 201721781 A | * | 6/2017 | | H01L 21/6835 |
| TW | 202034456 A | | 9/2020 | | |
| TW | 202111876 A | | 3/2021 | | |
| WO | WO-2007/136064 A1 | | 11/2007 | | |

* cited by examiner

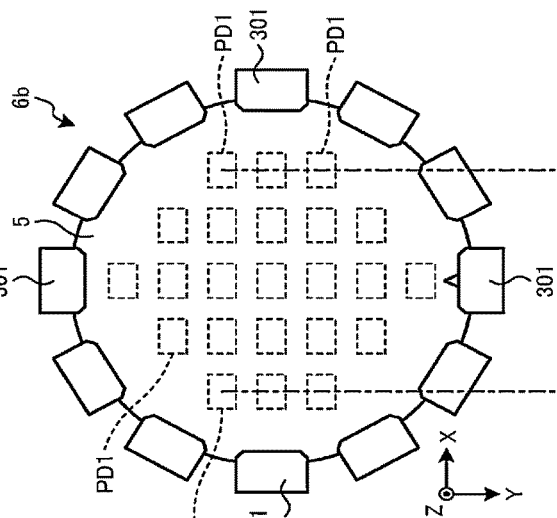 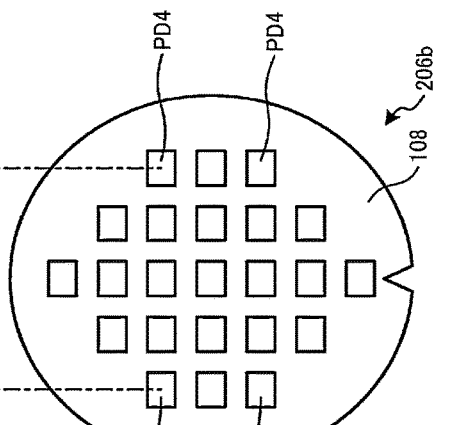
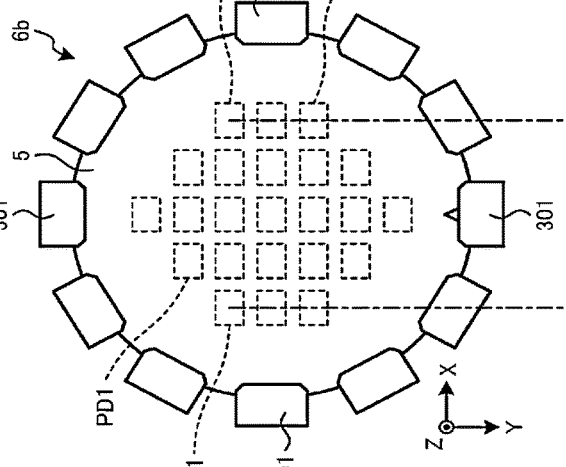 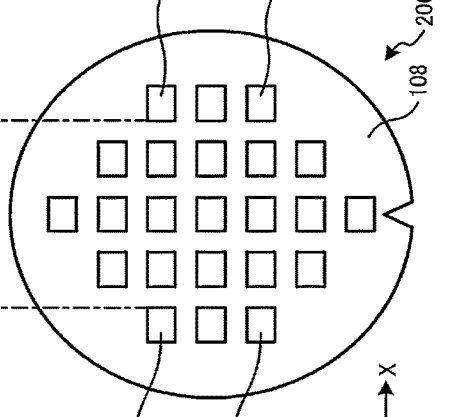
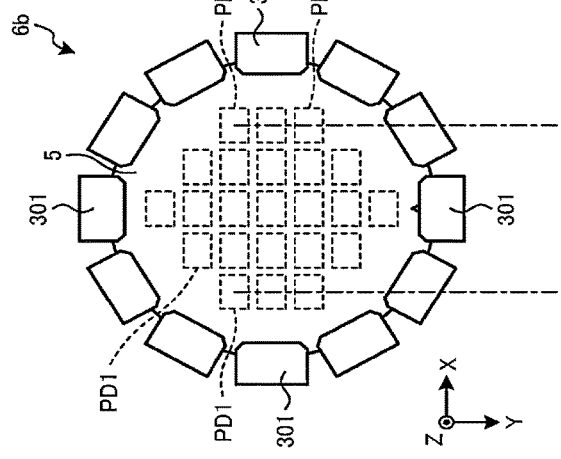 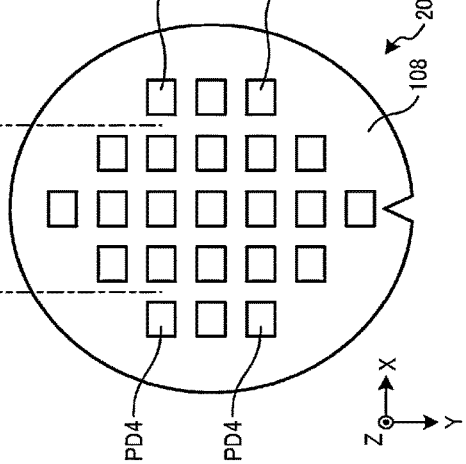

METHOD FOR MANUFACTURING SEMICONDUCTOR DEVICE

CROSS-REFERENCE TO RELATED APPLICATION(S)

This application is based upon and claims the benefit of priority from Japanese Patent Application No. 2022-098828, filed Jun. 20, 2022, the entire contents of which are incorporated herein by reference.

FIELD

Embodiments described herein relate generally to a method for manufacturing a semiconductor device.

BACKGROUND

In a method for manufacturing a semiconductor device, the semiconductor device is sometimes manufactured by bonding a plurality of substrates. At this time, the plurality of substrates are desired to be bonded appropriately.

DESCRIPTION OF THE DRAWINGS

FIGS. 11A to 11C are plan views illustrating the method for manufacturing the semiconductor device according to at least one embodiment.

DETAILED DESCRIPTION

Embodiments provide a method for manufacturing a semiconductor device capable of appropriately bonding a plurality of substrates.

In general, according to at least one embodiment, a method for manufacturing a semiconductor device is provided. In the method for manufacturing a semiconductor device, a first structure is formed on a first substrate. In the method for manufacturing a semiconductor device, a first bonded body is formed by bonding a supporting substrate lower in rigidity than the first substrate to a first principal surface, on which the first structure is formed, of the first substrate. In the method for manufacturing a semiconductor device, the first substrate is removed from the first bonded body. In the method for manufacturing a semiconductor device, a second structure is formed on a second substrate. In the method for manufacturing a semiconductor device, a third structure is formed on a third substrate. In the method for manufacturing a semiconductor device, a second bonded body is formed by bonding a second principal surface, on which the second structure is formed, of the second substrate to a third principal surface, on which the third structure is formed, of the third substrate. In the method for manufacturing a semiconductor device, the second substrate is removed from the second bonded body. In the method for manufacturing a semiconductor device, a third bonded body is formed by bonding a fourth principal surface, which is exposed after the first substrate is removed, of the first bonded body to a fifth principal surface, which is exposed after the second substrate is removed, of the second bonded body. In the method for manufacturing a semiconductor device, the supporting substrate is removed from the third bonded body.

Hereinafter, a method for manufacturing a semiconductor device according to an embodiment will be described in detail with reference to the accompanying drawings. It is noted that the disclosure is not limited to the embodiment.

Embodiment

In the method for manufacturing the semiconductor device according to the embodiment, the semiconductor device is manufactured by bonding a plurality of substrates. A way of appropriately bonding the plurality of substrates is contrived. For example, a semiconductor device 1 is manufactured as illustrated in FIGS. 1A to 12B. It is defined hereinafter that a direction perpendicular to a principal surface 2a of a substrate 2 is a Z direction and that two directions orthogonal to each other in a plane perpendicular to the Z direction are X and Y directions.

Figure 2A:
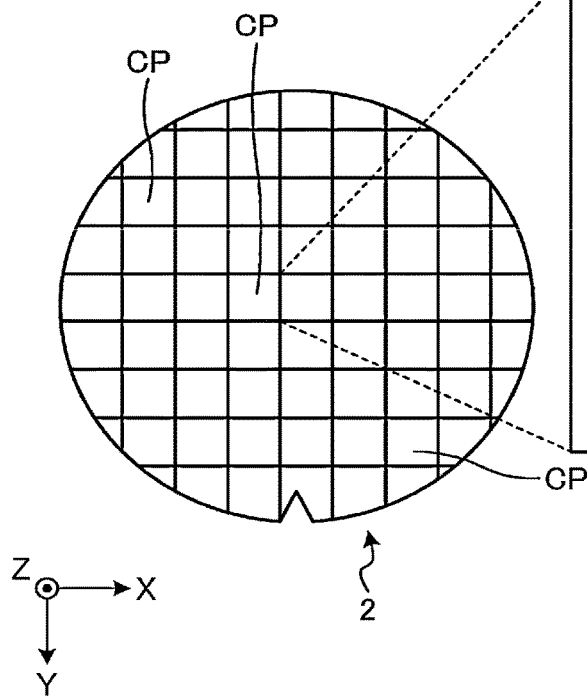
FIGS. 2A and 2B are plan views illustrating each chip region on a substrate according to at least one embodiment.
Figure 2B:
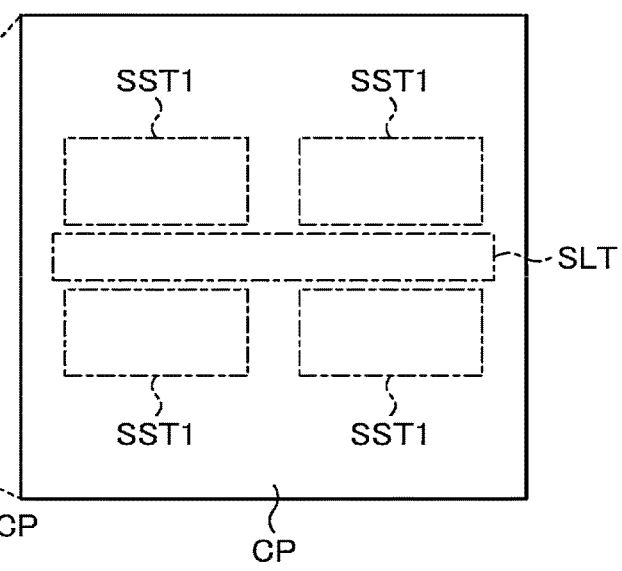
Figure 3:
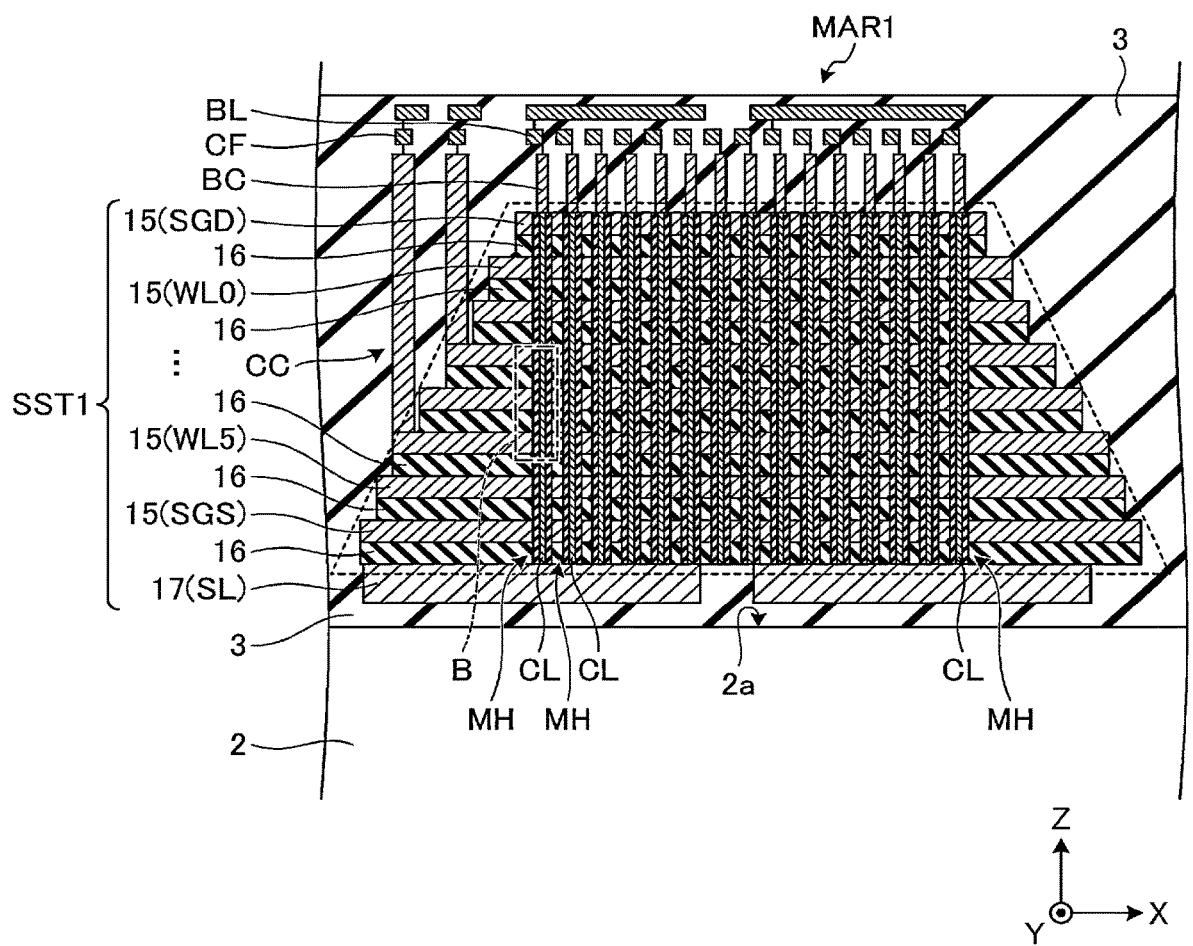
FIG. 3 is a cross-sectional view illustrating the method for manufacturing the semiconductor device according to at least one embodiment.
Figure 4A:
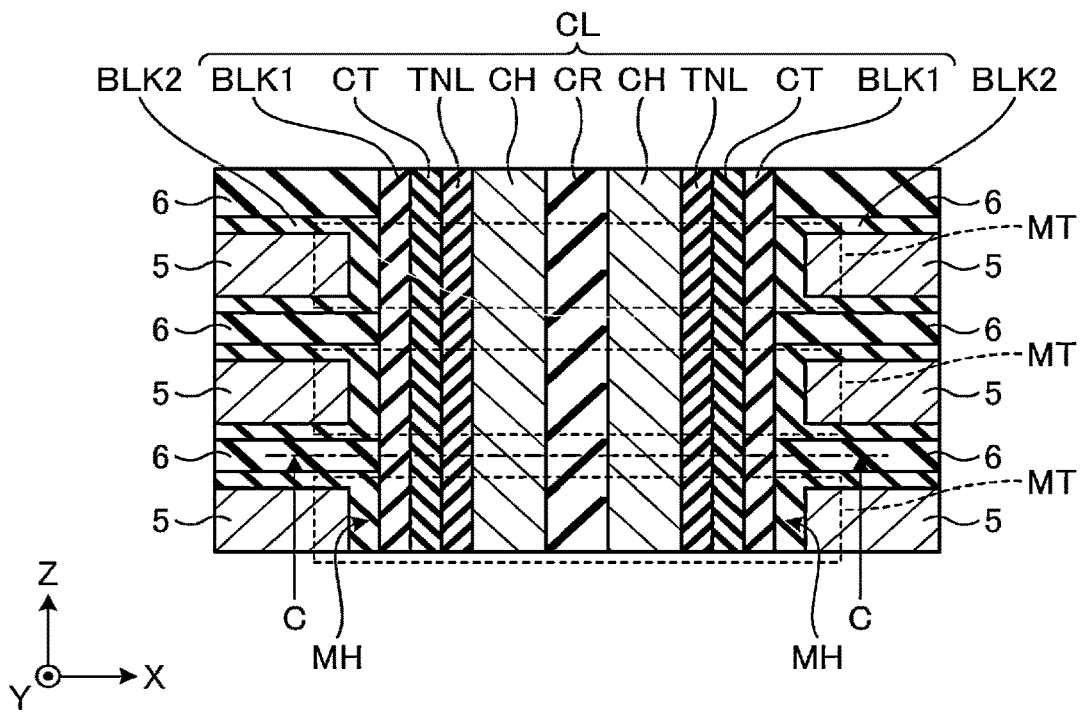
FIGS. 4A and 4B are cross-sectional views illustrating the method for manufacturing the semiconductor device according to at least one embodiment.
Figure 4B:
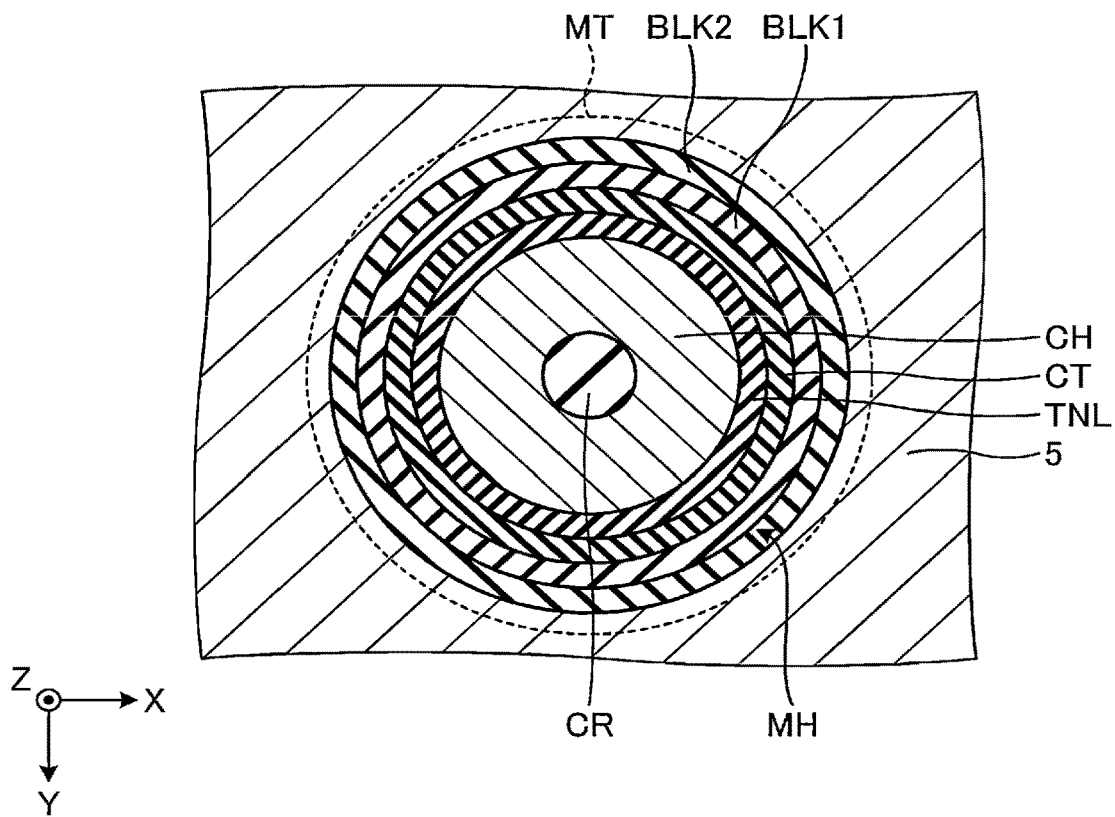

FIGS. 1A to 1C, 3, 4A, 5A to 10B, and 12A and 12B are XZ cross-sectional views illustrating the method for manufacturing the semiconductor device 1. FIG. 2A is an XY plan view illustrating an array of a plurality of chip regions CP on the substrate 2. FIG. 2B is an XY plan view illustrating an outline of a layout in each chip region CP. FIG. 3 is an XZ cross-sectional view illustrating a part A of FIG. 1B in an enlarging manner. FIG. 4A is an XZ cross-sectional view illustrating a part B of FIG. 3 in an enlarging manner. FIG. 4B is an XY cross-sectional view illustrating a cross-section taken along line C-C of FIG. 4A. FIGS. 11A to 11C are XY plan views illustrating the method for manufacturing the semiconductor device 1.

In the method for manufacturing the semiconductor device 1, processes illustrated in FIGS. 1A to 6B are performed in parallel to processes illustrated in FIGS. 7A to 9B. After completion of the processes illustrated in FIGS. 1A to 6B and the processes illustrated in FIGS. 7A to 9B, processes illustrated in FIGS. 10A to 12B are performed. As illustrated in FIG. 2A, each process is actually performed using a substrate on which the plurality of chip regions CP are mounted. For brevity, each XZ cross-sectional view illustrates a cross-section of the substrate on which one chip region CP is mounted.

Figure 1A:
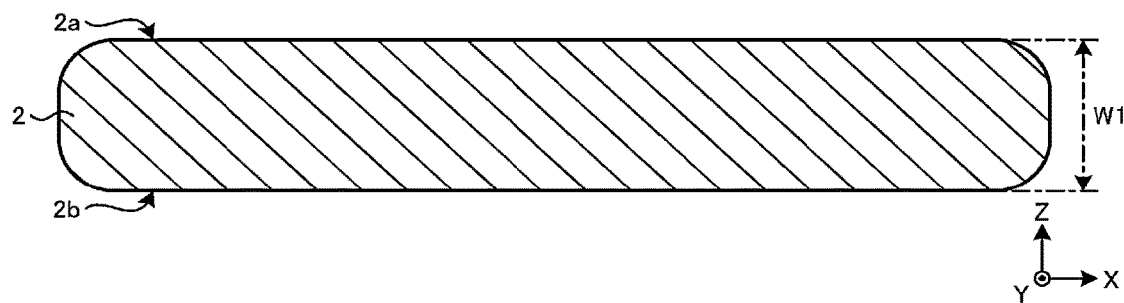
FIGS. 1A to 1C are cross-sectional views illustrating a method for manufacturing a semiconductor device according to at least one embodiment.

In the process illustrated in FIG. 1A, the substrate 2 is prepared. The substrate 2 is nearly disc-shaped, and is nearly circular in an XY plan view. The substrate 2 has the principal surface 2a on a +Z side and a principal surface 2b on a −Z side. The substrate 2 may be formed from a material mainly containing a semiconductor, e.g., silicon. A width of the substrate 2 in the Z direction is nearly W1.

Figure 1B:
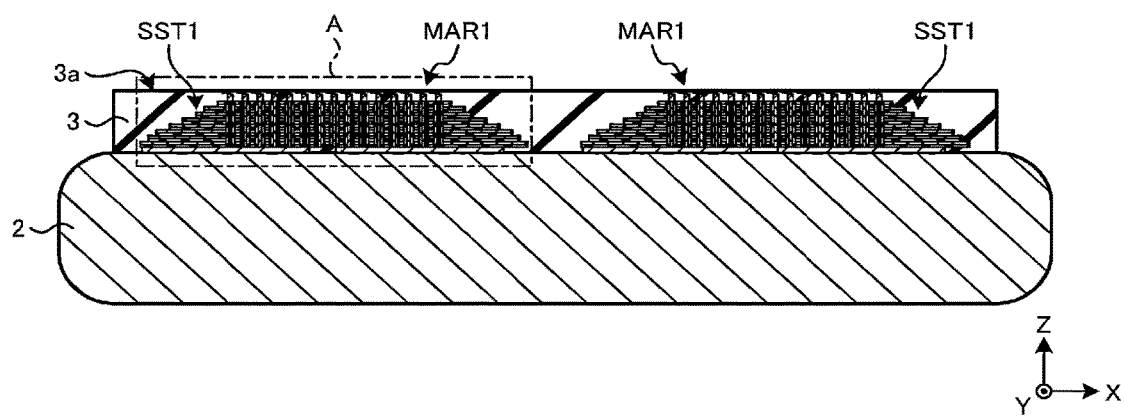

In the process illustrated in FIG. 1B, a memory cell array structure MARL including a stacked body SST1 is formed on the substrate 2. A plurality of memory cell array structures MARL may be formed on the substrate 2.

For example, after an insulating film 3 is deposited on the principal surface 2a of the substrate 2, a conductive film is deposited. The conductive film is patterned to form a conductive layer 17 as illustrated in FIG. 3. The insulating film 3 may be formed from an insulator such as silicon oxide. The conductive layer 17 may be formed from a semiconductor such as impurity-containing polysilicon to which conductive properties are imparted. Subsequently, an insulating layer 16 and a sacrificial layer, not illustrated, are alternately deposited a plurality of times on the +Z side of the conductive layer 17 to form the stacked body SST1. The insulating layer 16 may be formed from an insulator such as silicon oxide. The sacrificial layer may be formed from an insulator that enables an etching selectivity to be maintained between the sacrificial layer and the insulating layer 16 such as silicon nitride. Each insulating layer 16 and each sacrificial layer may be deposited at a nearly similar film thickness.

A resist pattern, in which a formation position of a parting film SLT illustrated in FIG. 2B is opened into a line extending in the X direction, is formed on the uppermost insulating layer 16 on the −Z side. When a resist pattern is formed, exposure processing is performed on the substrate 2. Before and/or after the exposure processing, the substrate 2 is heat-treated. Anisotropic etching such as a Reactive Ion Etching, i.e., RIE method is performed using the resist pattern as a mask to form a groove penetrating the stacked body SST1 in XZ directions. The parting film SLT is buried in the groove. The parting film SLT may be formed from a material mainly containing an insulator, e.g., silicon oxide. The parting film SLT extends in the XZ directions in the stacked body SST1 to part the stacked body SST1 in the Y direction. The parting film SLT parts the stacked body SST1 into a stacked body SST1 on a −Y side and a stacked body SST1 on a +Y side. In each stacked body SST1, the insulating layer 16 and the sacrificial layer are alternately stacked a plurality of times. Each stacked body SST1 has a nearly rectangular shape with the X direction defined as a longitudinal direction thereof in the XY plan view.

A resist pattern in which a formation position of each memory hole MH is opened, as illustrated in FIG. 3, is formed on the +Z side of an uppermost conductive layer 15 on the +Z side and the parting film SLT of each stacked body SST1. When a resist pattern is formed, exposure processing is performed on the substrate 2. Before and/or after the exposure processing, the substrate 2 is heat-treated. Anisotropic etching such as the RIE method is performed using the resist pattern as a mask to form the memory hole MH penetrating the stacked body SST1 and reaching the conductive layer 17.

As illustrated in FIGS. 4A and 4B, an insulating film BLK1 and an insulating film TNL are deposited in sequence on a side surface and a bottom surface of the memory hole MH. The insulating film BLK1 may be formed from an insulator such as silicon oxide. A portion of the insulating film TNL corresponding to the bottom surface of the memory hole MH is selectively removed.

A semiconductor film CH is deposited on the side surface and the bottom surface of the memory hole MH. The semiconductor film CH may be formed from a material mainly containing a semiconductor, e.g., polysilicon that does not substantially contain impurities. A core member CR is then buried in the memory hole MH. The core member CR may be formed from an insulator such as silicon oxide. A plurality of columnar bodies CL penetrating the stacked body SST1 in the Z direction are thereby formed. The plurality of columnar bodies CL are formed to be arrayed in the XY directions.

The sacrificial layers of the stacked body SST1 are removed. An insulating film BLK2 is formed on a surface to which cavities formed by the removal of the sacrificial layers are exposed. The insulating film BLK2 may be formed from an insulator such as aluminum oxide. A conductive layer 15 is further buried in each cavity. The conductive layer 15 may be formed from a material mainly containing a conductor, e.g., a metal such as tungsten. The stacked body SST1 in which the conductive layers 15 and the insulating layers 16 are alternately, repeatedly stacked is thereby formed.

The memory cell array structure MARL in which a plurality of memory cells are arrayed three-dimensionally is thereby formed. In the memory cell array structure MARL, the plurality of memory cells are formed at a plurality of positions where a plurality of conductive layers 15 and a plurality of semiconductor films CH cross one another in the stacked body SST1. It is noted that the conductive layer 17 functions as source region SL in the memory cell array structure MARL. Out of a plurality of conductive layers 15, the uppermost conductive layer 15 on the −Z side functions as a source-side select gate line SGS. Out of the plurality of conductive layers 15, the uppermost conductive layer 15 on the +Z side functions as a drain-side select gate line SGD. Out of the plurality of conductive layers 15, the remaining conductive layers 15 function as word lines WL, respectively.

In addition, the insulating film 3 is further deposited, holes are formed at positions of the insulating film 3 corresponding to the columnar bodies CL, and holes are formed at positions corresponding to end portions of the conductive layers 15 in the X direction. A conductor, e.g., a material mainly containing copper or the like, is buried in the holes to form plugs BC and CC. Furthermore, a conductive film is deposited on the +Z side of the plugs BC and CC and the conductive film is patterned. Conductive films BL and CF are thereby formed. The conductive films BL function as bit lines BL for the memory cell array structure MAR1.

Figure 1C:
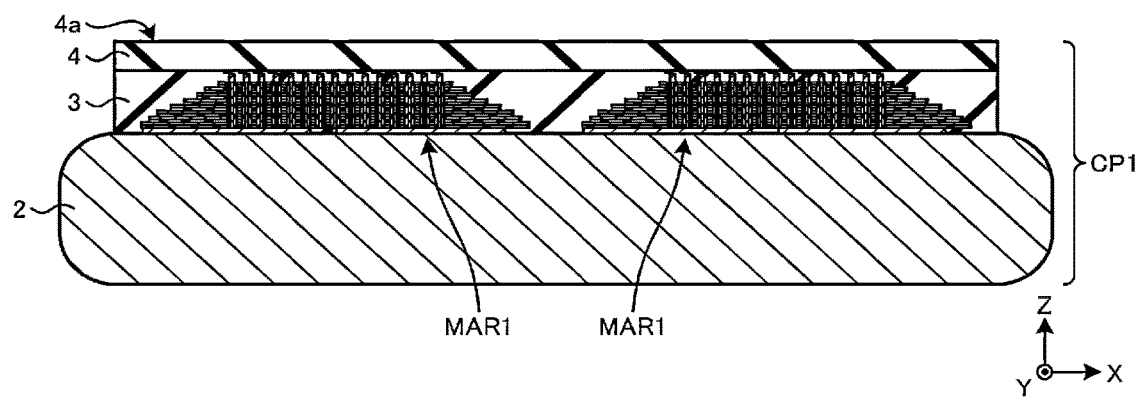

In the process illustrated in FIG. 1C, an insulating film 4 is deposited to cover the insulating film 3. The insulating film 4 may be formed from an insulator such as silicon oxide. The substrate 2 including a plurality of chip regions CP1 is thereby obtained. Each chip region CP1 includes the memory cell array structure MARL and is also referred to as "array chip".

Each stacked body SST1 is herein a structure in which the layers different in coefficient of thermal expansion are stacked alternately a plurality of times with the X direction defined as the longitudinal direction. The stacked body SST1 tends to have stress caused by the difference in coefficient of thermal expansion among the plurality of layers due to the heat treatment and the like in the course of manufacturing the stacked body SST1. The stacked body SST1 has a larger width on the +Z side in the X direction than that on the −Z side in the X direction.

When tensile stress in the X direction acts near a surface 4a on the +Z side of the insulating film 4, a warpage in the Y direction may be hardly generated and a warpage in the X direction may be generated in the substrate 2. While the substrate 2 is relatively flat in a YZ cross-sectional view, the substrate 2 may warp convexly on the −Z side in an XZ cross-sectional view.

Alternatively, when compressive stress in the X direction acts near the surface 4a of the insulating film 4, a warpage in the Y direction may be hardly generated and a warpage in the X direction may be generated in the substrate 2. While the substrate 2 is relatively flat in the YZ cross-sectional view, the substrate 2 may warp convexly on the +Z side in the XZ cross-sectional view.

Figure 5A:
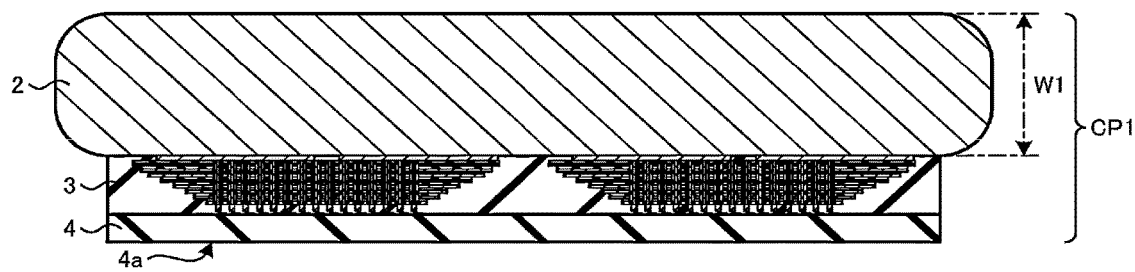
FIGS. 5A and 5B are cross-sectional views illustrating the method for manufacturing the semiconductor device according to at least one embodiment.

To address the warpage, a supporting substrate 5 is prepared in the process illustrated in FIG. 5A. The supporting substrate 5 is nearly disc-shaped, and is nearly circular in the XY plan view. The supporting substrate 5 has a front surface 5a on the +Z side and a rear surface 5b on the −Z side. A width of the supporting substrate 5 in the Z direction is nearly W2.

The supporting substrate 5 is lower in rigidity than the substrate 2. The supporting substrate 5 is configured to satisfy at least either a first condition or a second condition and is lower in rigidity than the substrate 2.

The first condition includes that the supporting substrate 5 is softer than the substrate 2. The first condition includes that the supporting substrate 5 is formed from a material lower in Young's modulus than the substrate 2. When the substrate 2 is formed from a material mainly containing a semiconductor, e.g., silicon, the supporting substrate 5 may be formed from a material mainly containing one or more substances belonging to a first group. The first group includes rubber, Teflon (registered trademark), polyethylene, polypropylene, polyacetal copolymer, polystyrene, polycarbonate, nylon, wood, concrete, magnesium alloy, aluminum, aluminum alloy, glass, brass, titanium, copper, cast iron, lead, gold, silver, and zinc.

The second condition includes that the supporting substrate 5 has a cross-sectional shape more deformable than the substrate 2. The second condition includes that regarding cross-sections including the Z direction, the supporting substrate 5 is smaller in a geometrical moment of inertia than the substrate 2. The thickness W2 in the Z direction of the supporting substrate 5 may be smaller than the thickness W1 in the Z direction of the substrate 2.

As illustrated in FIG. 5A, the substrate 2 and the supporting substrate 5 are disposed so that the surface 4a is opposed to the front surface 5a in the Z direction.

Figure 5B:
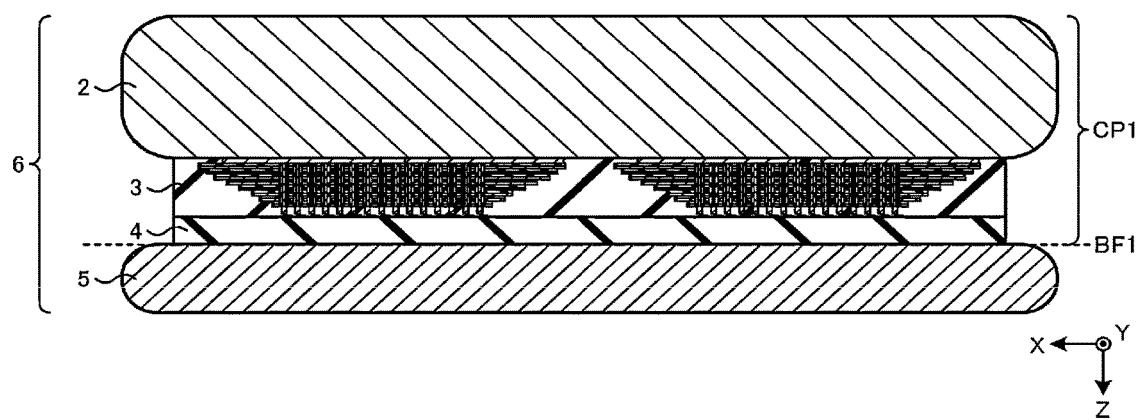

In the process illustrated in FIG. 5B, the substrate 2 and the supporting substrate 5 are disposed closer to each other in the Z direction, and the surface 4a of the insulating film 4 is bonded to the front surface 5a of the supporting substrate 5. The surface 4a of the insulating film 4 may be bonded to the front surface 5a of the supporting substrate 5 via an adhesive or by direct bonding. At this time, the substrate 2 and the supporting substrate 5 may be heated and pressurized. This forms a bonded body 6 in which the substrate 2 is bonded to the supporting substrate 5 on a bonded surface BF1.

In this case, the supporting substrate 5 can absorb the stress of the warpage of the substrate 2 to some extent to mitigate and reduce the stress since being lower in rigidity than the substrate 2 and prone to deform in response to the warpage of the substrate 2. As a result, the bonded body 6 with the warpage mitigated and reduced is obtained.

Figure 6A:
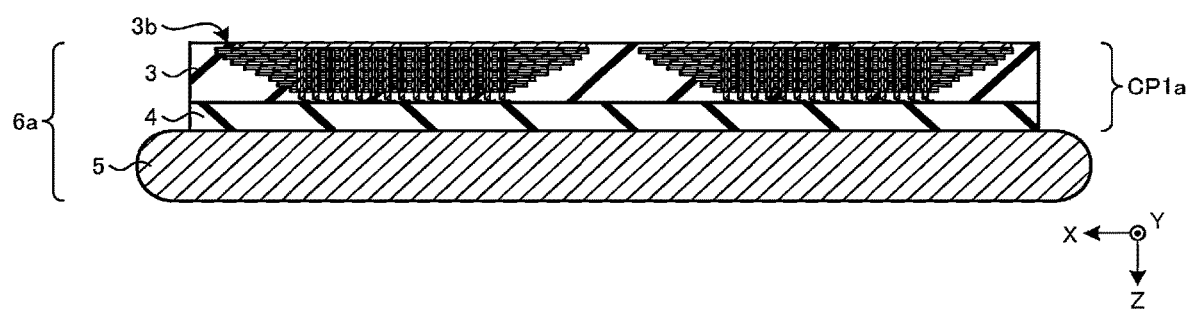
FIGS. 6A and 6B are cross-sectional views illustrating the method for manufacturing the semiconductor device according to at least one embodiment.

In the process illustrated in FIG. 6A, the substrate 2 is removed from the bonded body 6. The substrate 2 may be removed by polishing the substrate 2 from the −Z side or performing wet etching as well as the polishing. A principal surface 3b on the −Z side of the insulating film 3 is thereby exposed in each chip region CP1a of a bonded body 6a.

Figure 6B:
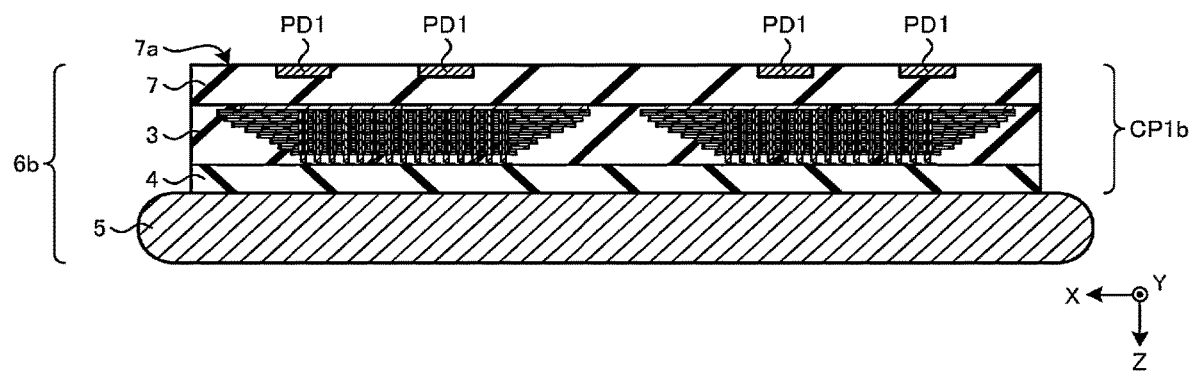

In the process illustrated in FIG. 6B, an insulating film 7 is deposited to cover the principal surface 3b of the insulating film 3. The insulating film 7 may be formed from an insulator such as silicon oxide. Holes and/or grooves are formed in the insulating film 3. A conductor, e.g., a material mainly containing copper or the like, is buried in the holes and/or the grooves to form electrodes PD1. In each chip region CP1b of a bonded body 6b, a principal surface 7a on the −Z side of the insulating film 7 is exposed, and a plurality of electrodes PD1 are thereby disposed on the principal surface 7a.

Figure 7A:
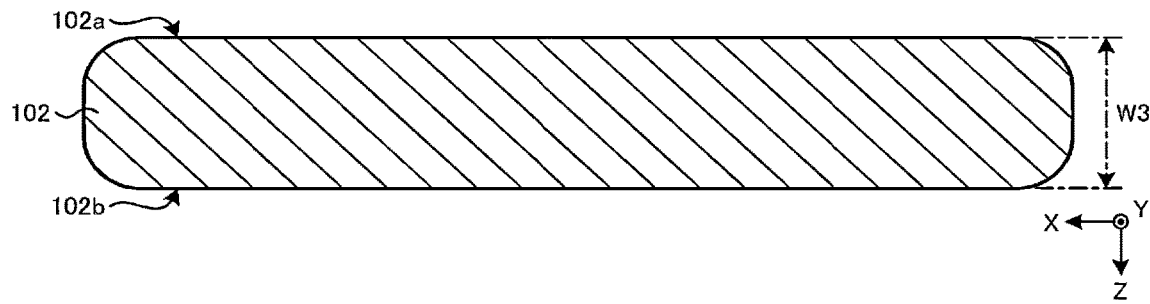
FIGS. 7A to 7C are cross-sectional views illustrating the method for manufacturing the semiconductor device according to at least one embodiment.

In the process illustrated in FIG. 7A, a substrate 102 is prepared. The substrate 102 is nearly disc-shaped, and is nearly circular in the XY plan view. The substrate 102 has a principal surface 102a on the −Z side and a principal surface 102b on the +Z side. The substrate 102 may be formed from a material mainly containing a semiconductor, e.g., silicon. A width of the substrate 102 in the Z direction is nearly W3. The width W3 in the Z direction of the substrate 102 may be larger than the width W2 in the Z direction of the supporting substrate 5.

Figure 7B:
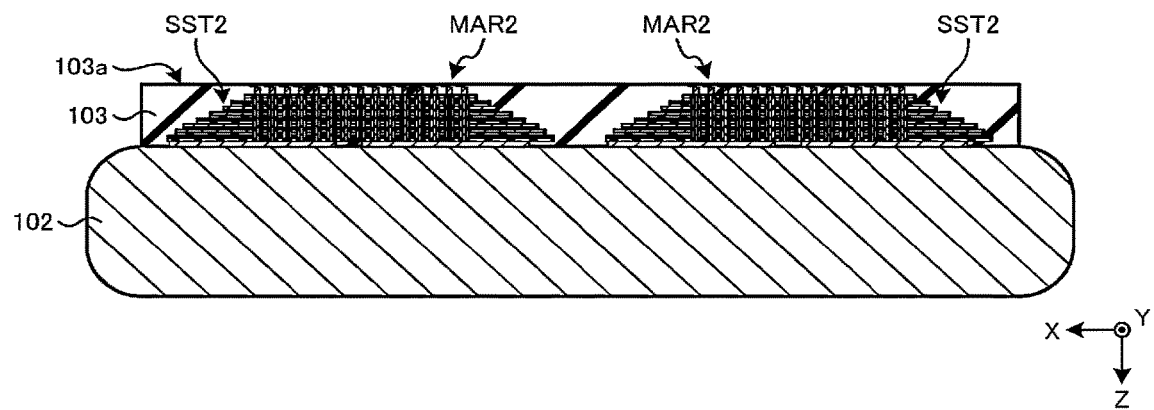

In the process illustrated in FIG. 7B, a memory cell array structure MAR2 including a stacked body SST2 is formed on the substrate 102. A plurality of memory cell array structures MAR2 may be formed on the substrate 102. The memory cell array structure MAR2 including the stacked body SST2 may be formed similarly to the process illustrated in FIG. 1B.

Figure 7C:
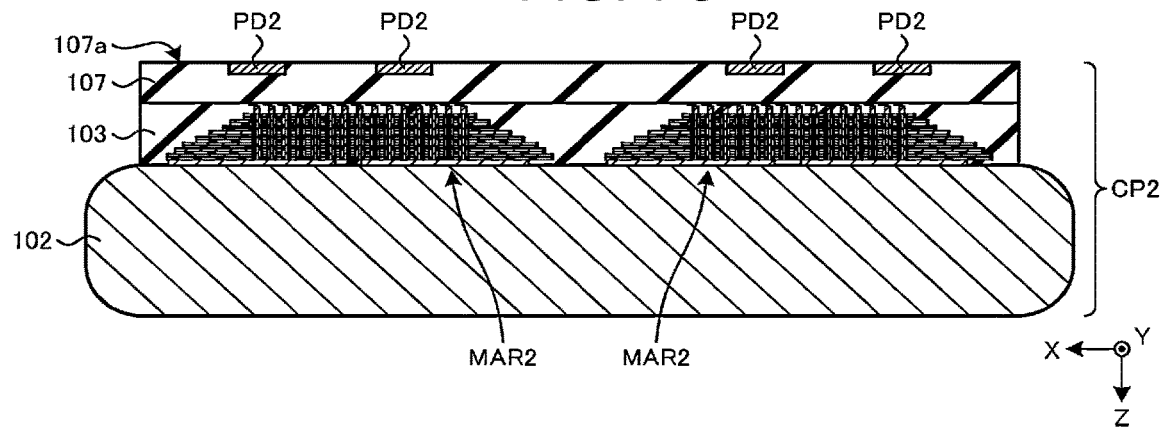

In the process illustrated in FIG. 7C, an insulating film 107 is deposited to cover a principal surface 103a on the −Z side of the insulating film 103. The insulating film 107 may be formed from an insulator such as silicon oxide. Holes and/or grooves are formed in the insulating film 103. A conductor, e.g., a material mainly containing copper or the like, is buried in the holes and/or the grooves to form electrodes PD2. The substrate 102 including a plurality of chip regions CP2 is thereby obtained. Each chip region CP2 includes the memory cell array structure MAR2 and is also referred to as "array chip". A principal surface 107a on the −Z side of the insulating film 107 is exposed in each chip region CP2 and a plurality of electrodes PD2 are disposed on the principal surface 107a.

Figure 8A:
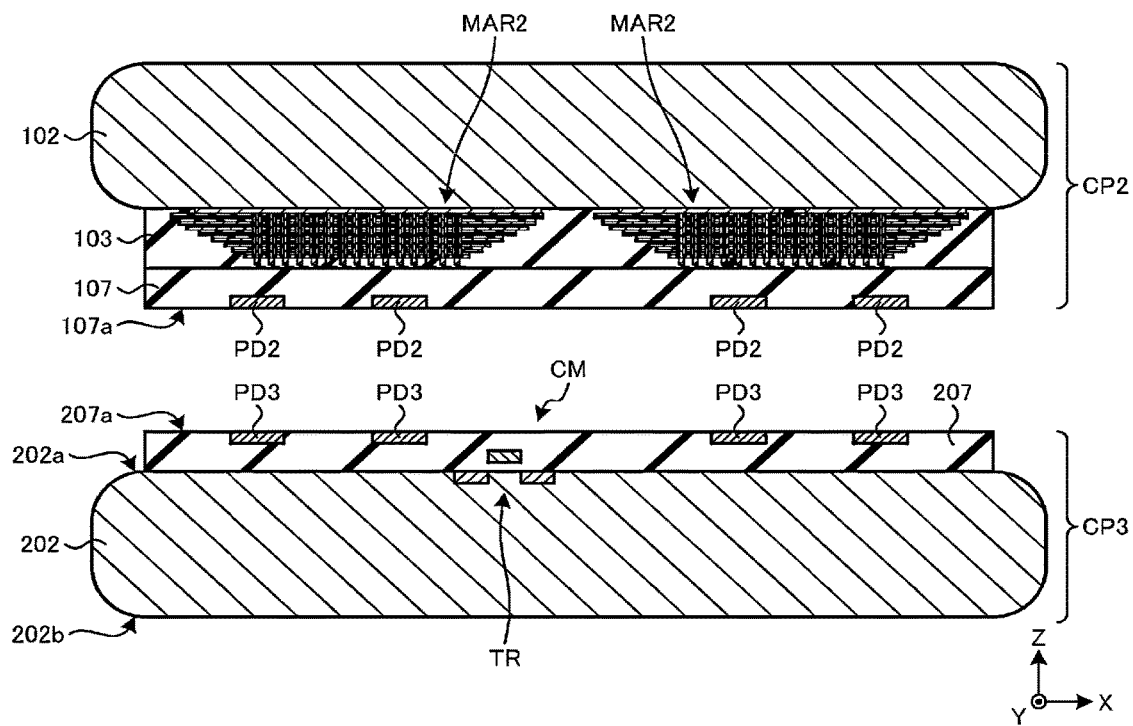
FIGS. 8A and 8B are cross-sectional views illustrating the method for manufacturing the semiconductor device according to at least one embodiment.

In the process illustrated in FIG. 8A, a substrate 202 is prepared. The substrate 202 may be formed from a material mainly containing a semiconductor, e.g., silicon. The substrate 202 has a principal surface 202a on the +Z side and a principal surface 202b on the −Z side.

Impurities are introduced into partial regions of the principal surface 202a of the substrate 202 and a conductive film is deposited and patterned on the principal surface 202a to form electrodes of a transistor TR. The conductive film may be formed from a semiconductor, e.g., polysilicon to which conductive properties are imparted. An insulating film 207 is deposited to cover the transistor TR. The insulating film 207 may be formed from silicon oxide. Subsequently, holes for exposing the electrodes of the transistor TR are formed in the insulating film 207 and a conductor, e.g., tungsten is buried in the holes to form an interconnection structure. A circuit structure CM including the transistor TR is thereby formed.

The insulating film 207 is further deposited to form holes and/or grooves in the insulating film 207. A conductor, e.g., a material mainly containing copper or the like, is buried in the holes and/or the grooves to form electrodes PD3. The substrate 202 including a plurality of chip regions CP3 is thereby obtained. Each chip region CP3 includes the circuit structure CM and is also referred to as "circuit chip". A principal surface 207a on the +Z side of the insulating film 207 is exposed in each chip region CP3 and a plurality of electrodes PD3 are disposed on the principal surface 207a.

The principal surface 107a of the substrate 102 and the principal surface 207a of the substrate 202 may be activated by plasma irradiation or the like. The substrates 102 and 202 are disposed so that the principal surface 107a is opposed to the principal surface 207a. XY positions of the substrate 102 and XY positions of the substrate 202 are aligned so that XY positions of the electrodes PD2 on the principal surface 107a correspond to XY positions of the electrodes PD3 on the principal surface 207a.

The memory cell array structure MAR2 herein tends to generate a warpage in the substrate 102, while the circuit structure CM does not tend to generate a warpage in the substrate 202. That is, the substrate 102 having a large warpage is bonded to the substrate 202 having a minor warpage. The XY positions of the substrate 102 and the XY positions of the substrate 202 can be aligned in consideration of misalignment of bonding of the substrate 102 having the large warpage relative to the substrate 202 having the minor warpage.

Figure 8B:
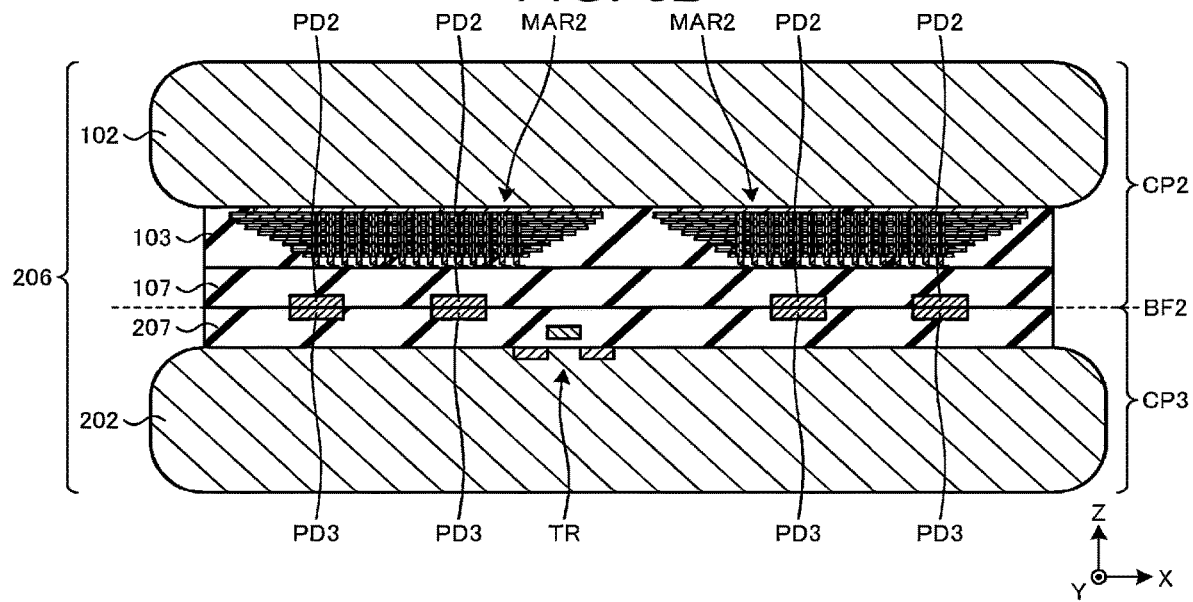

In the process illustrated in FIG. 8B, the substrates 102 and 202 are disposed closer to each other in the Z direction, and the principal surface 107a of the insulating film 107 is bonded to the principal surface 207a of the insulating film 207. At this time, the substrates 102 and 202 may be heated and pressurized. It is thereby possible to bond the substrate 102 having the large warpage to the substrate 202 having the minor warpage and easily align and bond the electrodes PD2 to the electrodes PD3.

This forms a bonded body 206 in which the substrate 102 is bonded to the substrate 202 on a bonded surface BF2. On the bonded surface BF2, the principal surface 107a of the insulating film 107 can be bonded to the principal surface 207a of the insulating film 207 by direct bonding, and the electrodes PD2 can be bonded to the electrodes PD3 by direct bonding.

Figure 9A:
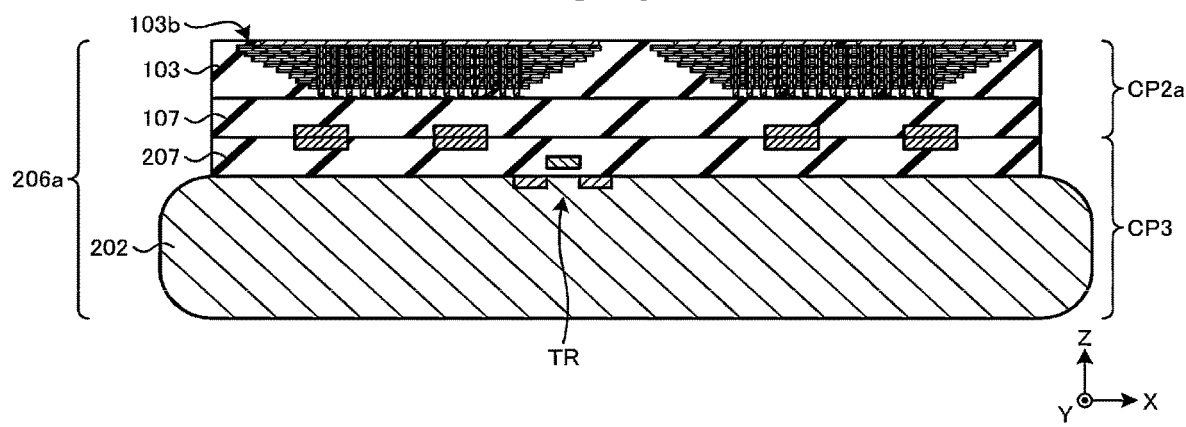
FIGS. 9A and 9B are cross-sectional views illustrating the method for manufacturing the semiconductor device according to at least one embodiment.

In the process illustrated in FIG. 9A, the substrate 102 is removed from the bonded body 206. The substrate 102 may be removed by polishing the substrate 102 from the +Z side or performing wet etching as well as the polishing. A principal surface 103b on the +Z side of the insulating film 103 is thereby exposed in each chip region CP2a of a bonded body 206a.

Figure 9B:
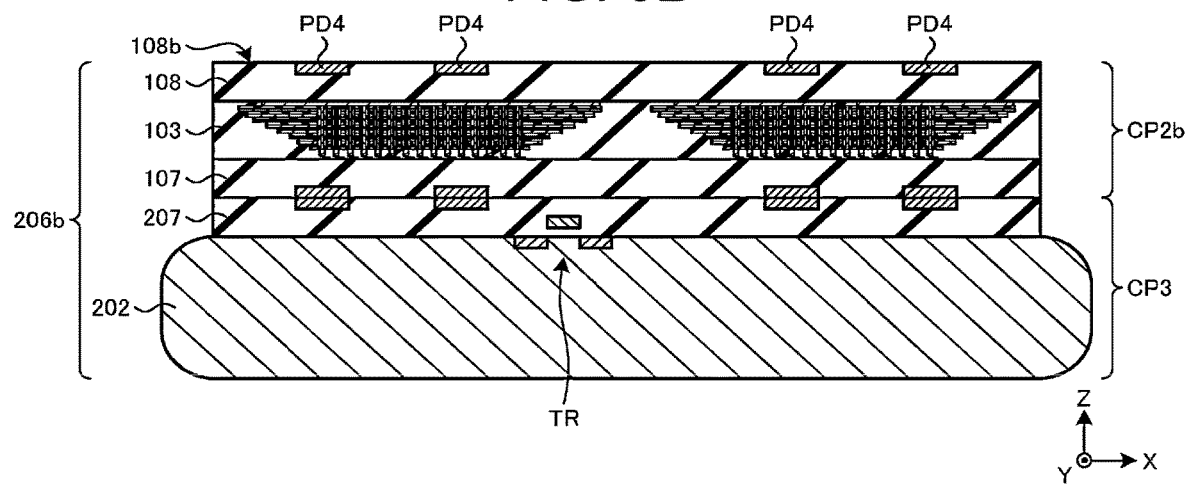

In the process illustrated in FIG. 9B, an insulating film 108 is deposited to cover the principal surface 103b of the insulating film 103. The insulating film 108 may be formed from an insulator such as silicon oxide. Holes and/or grooves are formed in the insulating film 108. A conductor, e.g., a material mainly containing copper or the like, is buried in the holes and/or the grooves to form electrodes PD4. In each chip region CP2b of a bonded body 206b, a principal surface 108b of the insulating film 108 is exposed, and a plurality of electrodes PD4 are thereby disposed on the principal surface 108b.

Figure 10A:
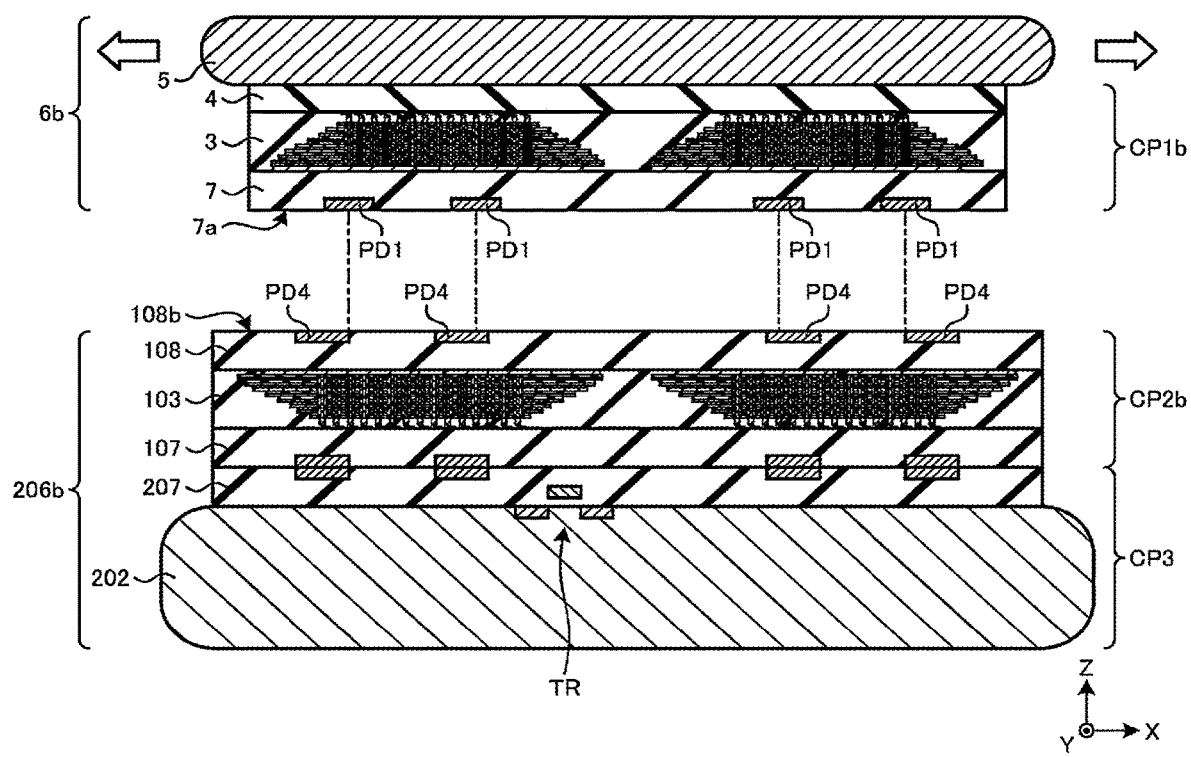
FIGS. 10A and 10B are cross-sectional views illustrating the method for manufacturing the semiconductor device according to at least one embodiment.

In the process illustrated in FIG. 10A, the bonded body 6b illustrated in FIG. 6B and the bonded body 206b illustrated in FIG. 9B are disposed so that the principal surface 7a is opposed to the principal surface 108b. At this time, the bonded body 6b is often relatively smaller in size than the bonded body 206b.

On the other hand, since the supporting substrate 5 is lower in rigidity than the substrate 2, the supporting substrate 5 can be extended in the XY directions to correct a magnification of the bonded body 6b as illustrated in FIG. 11A→FIG. 11B→FIG. 11C in sequence.

For example, as illustrated in an upper view of FIG. 11A, a plurality of holding members 301 hold an outer edge of the supporting substrate 5 at approximately constant intervals in an outer peripheral direction. At this time, a disposition pitch in the XY directions of the electrodes PD1 of the bonded body 6b illustrated in the upper view of FIG. 11A is narrower than a disposition pitch of the electrodes PD4 in the XY directions of the bonded body 206b illustrated in a lower view of FIG. 11A.

When the plurality of holding members 301 pull the outer edge of the supporting substrate 5 with approximately constant stress outward in the XY directions, the disposition pitch in the XY directions of the electrodes PD1 of the bonded body 6b illustrated in an upper view of FIG. 11B becomes slightly wide and closer to the disposition pitch in the XY directions of the electrodes PD4 of the bonded body 206b illustrated in a lower view of FIG. 11B.

When the plurality of holding members 301 pull further the outer edge of the supporting substrate 5 with approximately constant stress outward in the XY directions, the disposition pitch in the XY directions of the electrodes PD1 of the bonded body 6b illustrated in an upper view of FIG. 11C becomes almost equal to the disposition pitch in the XY directions of the electrodes PD4 of the bonded body 206b illustrated in a lower view of FIG. 11C. In FIG. 11C, chain lines indicate that the disposition pitches are equal.

It is noted that in the processes illustrated in FIG. 11A→FIG. 11B→FIG. 11C, the supporting substrate 5 may be extended in the XY directions while being heated. At this time, the ease of extending the supporting substrate 5 can be adjusted depending on a heating temperature.

Figure 10B:
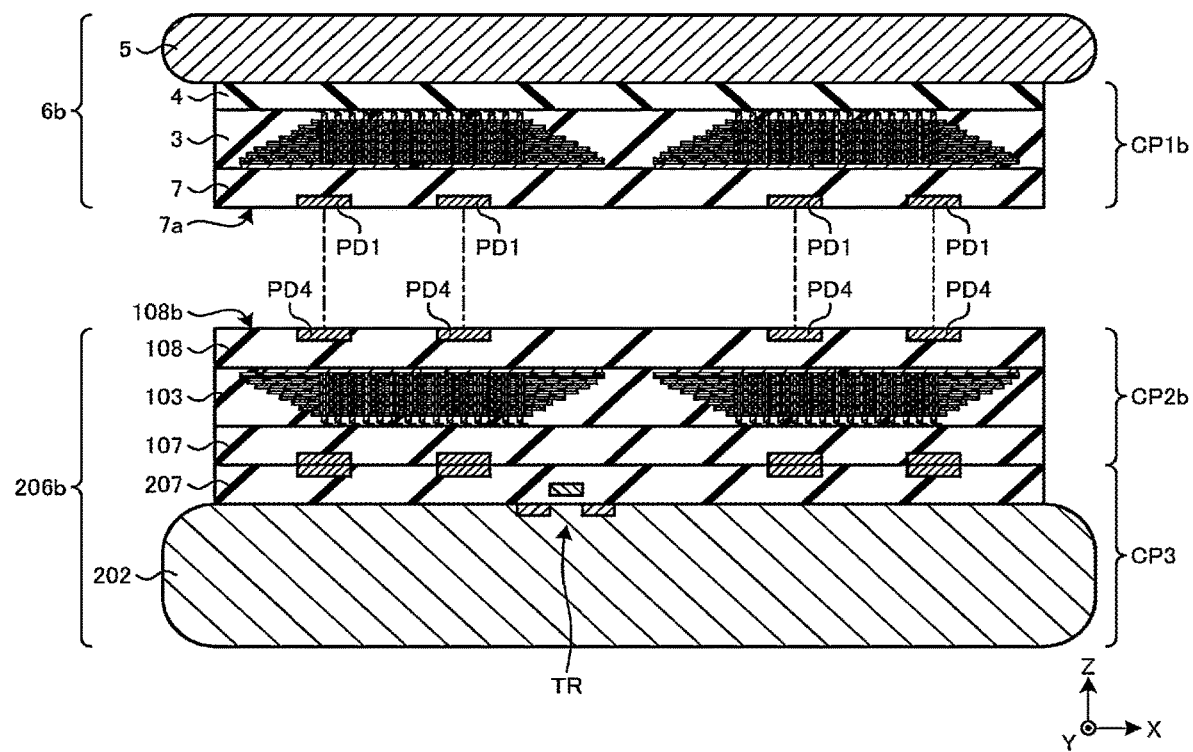

In the process illustrated in FIG. 10B, the bonded body 6b is aligned to the bonded body 206b in a state in which the disposition pitch in the XY directions of the electrodes PD1 of the bonded body 6b becomes almost equal to the disposition pitch in the XY directions of the electrodes PD4 of the bonded body 206b. In FIG. 10B, chain lines indicate that the disposition pitches are equal. XY positions of the bonded body 6b and XY positions of the bonded body 206b are aligned relative to each other so that XY positions of the electrodes PD1 on the principal surface 7a correspond to XY positions of the electrodes PD4 on the principal surface 108b.

Although the memory cell array structure MAR2 herein tends to generate a warpage in the bonded body 206b, the supporting substrate 5 may mitigate a warpage of the bonded body 6b. That is, the bonded body 206b having a large warpage is bonded to the bonded body 6b having a minor warpage. The XY positions of the bonded body 6b and the XY positions of the bonded body 206b can be aligned relative to each other in consideration of the misalignment of bonding of the bonded body 206b having the large warpage relative to the bonded body 6b having the minor warpage.

Figure 12A:
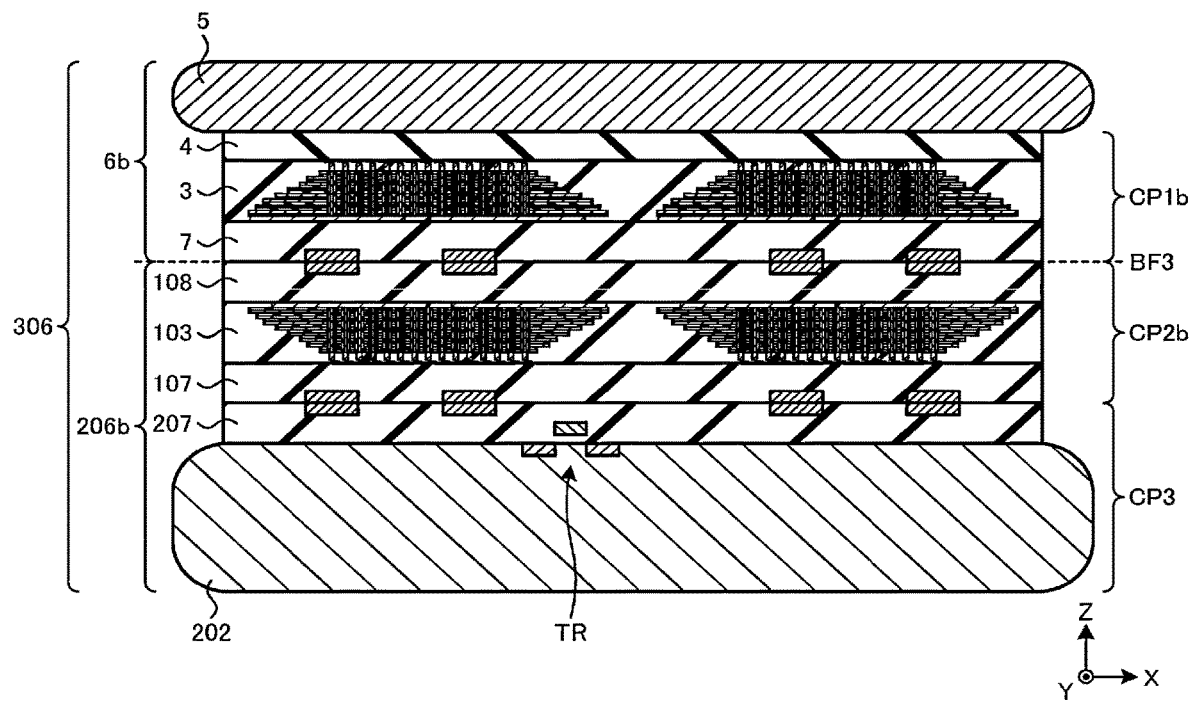
FIGS. 12A and 12B are cross-sectional views illustrating the method for manufacturing the semiconductor device according to at least one embodiment.

In the process illustrated in FIG. 12A, the bonded bodies 6b and 206b are disposed closer to each other in the Z direction, and the principal surface 7a is bonded to the principal surface 108b. At this time, the supporting substrate 5 and the substrate 202 may be heated and pressurized. It is thereby possible to bond the bonded body 6b having the minor warpage to the bonded body 206b having the large warpage and easily align and bond the electrodes PD1 to the electrodes PD4.

This forms a bonded body 306 in which the bonded body 6b is bonded to the bonded body 206b on a bonded surface BF3. On the bonded surface BF3, the principal surface 7a of the insulating film 7 can be bonded to the principal surface 108b of the insulating film 108 by direct bonding, and the electrodes PD1 can be bonded to the electrodes PD4 by direct bonding.

Figure 12B:
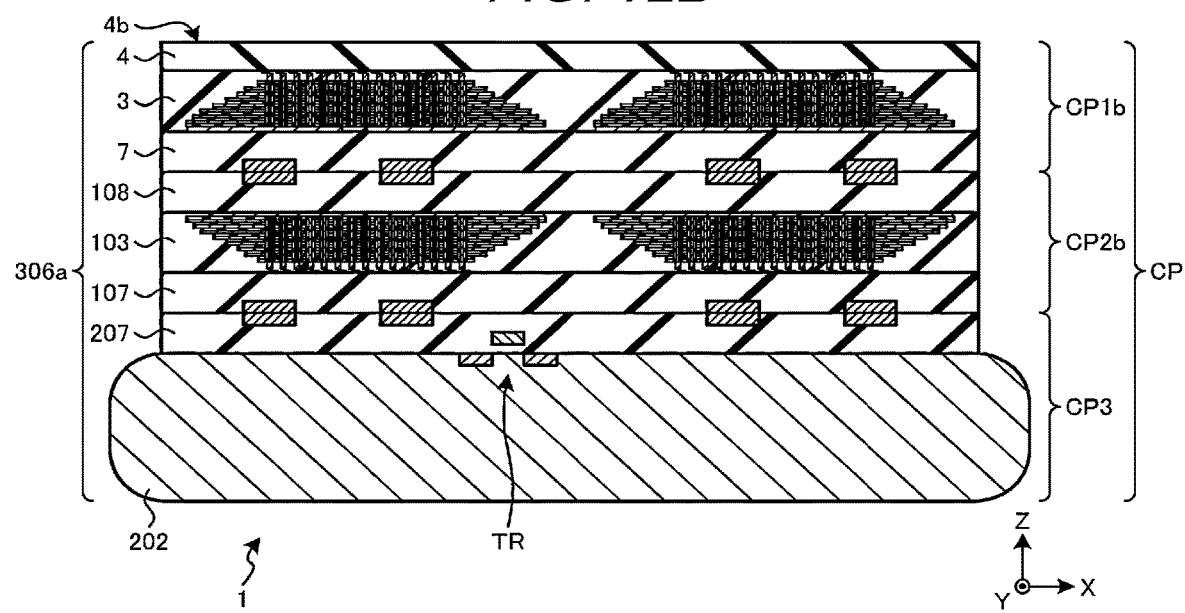

In the process illustrated in FIG. 12B, the supporting substrate 5 is removed from the bonded body 306. The supporting substrate 5 may be removed by polishing the supporting substrate 5 from the −Z side or performing wet etching as well as the polishing. Alternatively, when the supporting substrate 5 is adhesively bonded to the insulating film 4 via an adhesive, the supporting substrate 5 may be removed by irradiating the adhesive with a laser beam to thermally modify the adhesive and weaken a strength of the adhesive and inserting a blade into the adhesive. The principal surface 4b on the +Z side of the insulating film 4 is thereby exposed in each chip region CP of a bonded body 306a.

In each chip region CP, the chip regions CP3, CP2b, and CP1b are stacked in the Z direction. In each chip region CP, a structure in which the array chips CP2b and CP1b are stacked on the circuit chip CP3 is formed. This structure may be referred to as "multi-stack array structure". By dicing the bonded body 306a in boundaries of the chip region CP, the chip region CP is diced into a plurality of chip regions CP. The semiconductor device 1 including the chip regions CP of the multi-stack array structure is thereby obtained.

As described so far, according to the embodiment, the bonded body 6b having the mitigated warpage is obtained by bonding the supporting substrate 5 to the substrate 2 on which the memory cell array structure MAR1 is formed. Subsequently, the bonded body 6b having the mitigated warpage is bonded to the bonded body 206b on which the memory cell array structure MAR2 is formed, to form the bonded body 306. It is thereby possible to bond the bonded body 6b having the minor warpage to the bonded body 206b having the large warpage and easily align and bond the electrodes PD1 to the electrodes PD4. That is, a plurality of substrates can be bonded appropriately.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method for manufacturing a semiconductor device, comprising:
    forming a first structure on a first substrate;
    forming a first bonded body by coupling a supporting substrate lower in rigidity than the first substrate to a first principal surface of the first substrate, the first structure is formed on the first principal surface;
    removing the first substrate from the first bonded body;
    forming a second structure on a second substrate;
    forming a third structure on a third substrate;
    forming a second bonded body by coupling a second principal surface of the second substrate to a third principal surface, the second structure is formed on the second principal surface, the third structure is formed on the third principal surface;
    removing the second substrate from the second bonded body;
    forming a third bonded body by coupling a fourth principal surface, which is exposed after the first substrate is removed, of the first bonded body to a fifth principal surface, which is exposed after the second substrate is removed, of the second bonded body; and
    removing the supporting substrate from the third bonded body.

2. The method for manufacturing a semiconductor device according to claim 1, wherein
    a Young's modulus of the supporting substrate is lower than a Young's modulus of the first substrate.

3. The method for manufacturing the semiconductor device according to claim 1, wherein
    a geometrical moment of inertia of the supporting substrate is smaller than a geometrical moment of inertia of the first substrate.

4. The method for manufacturing a semiconductor device according to claim 1, wherein
    a thickness of the supporting substrate is smaller than a thickness of the first substrate.

5. The method for manufacturing a semiconductor device according to claim 1, further comprising
    extending the supporting substrate in a plane direction between forming the first bonded body and forming the third bonded body.

6. The method for manufacturing a semiconductor device according to claim 1, wherein
    the first structure includes a first memory cell array structure,
    the second structure includes a circuit structure, and
    the third structure includes a second memory cell array structure.

7. The method for manufacturing a semiconductor device according to claim 1, wherein the bonding to form the first bonded body is performed by heating and pressurizing.

8. The method for manufacturing a semiconductor device according to claim 1, wherein the bonding to form the first bonded body is performed using adhesive or direct bonding.

9. The method for manufacturing a semiconductor device according to claim 1, wherein the first substrate is formed of a semiconductor material.

10. The method for manufacturing a semiconductor device according to claim 9, wherein the first substrate is formed of a silicon material.

11. The method for manufacturing a semiconductor device according to claim 1, wherein before the first substrate is removed, the first substrate has an insulating film contacting the support substrate.

12. The method for manufacturing a semiconductor device according to claim 11, wherein the insulating film is formed of silicon oxide.

13. The method for manufacturing a semiconductor device according to claim 1, wherein the support substrate has a higher rigidity in one direction of the first principal surface than in another direction of the first principal surface.

14. The method for manufacturing a semiconductor device according to claim 1, wherein the removing the first substrate is performed by polishing or etching.

\* \* \* \* \*